United States Patent [19]
Harvey et al.

[11] Patent Number: 5,298,085
[45] Date of Patent: Mar. 29, 1994

[54] SUPPORT BLANKET FOR SOLAR CELL ARRAYS

[75] Inventors: T. Jeffrey Harvey, Lompoc; P. Alan Jones, Santa Barbara, both of Calif.

[73] Assignee: AEC-Able Engineering Company, Inc., Goleta, Calif.

[21] Appl. No.: 857,542

[22] Filed: Mar. 24, 1992

[51] Int. Cl.$^5$ .............................. H01L 31/042
[52] U.S. Cl. ............................ 136/244; 136/245; 428/113; 428/131; 428/225; 428/228; 428/273; 428/288; 428/290
[58] Field of Search ............... 136/244, 245, 256, 251; 428/109, 113, 131, 134-136, 224-225, 228, 260, 262, 273, 288-290

[56] References Cited

U.S. PATENT DOCUMENTS 4,968,372 11/1990 Maass ..................... 156/249

Primary Examiner—Aaron Weisstuch
Attorney, Agent, or Firm—Donald D. Mon

[57] ABSTRACT

An assembly of an array of solar cells and a substrate blanket to which they are mounted. The blanket is woven from glass fibers and coated with a silicone. The blanket, because of its composition, is resistant to attack by atomic oxygen, flexible, a good electrical insulator, and a good thermal conductor.

8 Claims, 1 Drawing Sheet

SUPPORT BLANKET FOR SOLAR CELL ARRAYS

FIELD OF THE INVENTION

This invention relates to the combination of a solar cell array and a substrate blanket which is resistant to atomic oxygen, and to which the cells are mounted.

BACKGROUND OF THE INVENTION

Blankets for supporting solar cells have generally utilized substrates made of Kapton, which is a polyimide composition. It has been learned that Kapton is subject to attack by atomic oxygen which exists in low-earth orbits. Because Kapton does have many desirable characteristics, and has been so widely used for support blankets, efforts were made to protect the Kapton from atomic oxygen by coating it with substances which are resistant to it. Silicon dioxide has generally been used for this purpose. However, in use and over time, this coating tends to crack, and the Kapton is attacked by atomic oxygen which passes through the cracks.

It is an object of this invention to provide a support blanket which is inherently resistant to attack by atomic oxygen, and is not subject to degradation by it.

Support blankets for solar cell arrays which are to be used in space should be lightweight and flexible. Further, internal stresses which can be generated during thermal cycles should be minimized. Also, the blanket should be a good electrical insulator, and preferably also be a good thermal conductor.

Because the woven strands of the blanket and the solar cells are the stiffest parts of the assembly, they are the driving or determinant elements which tend to generate internal stresses. A close match of their coefficients of thermal expansion will result in less stress than would be generated by a combination of elements which have a greater difference in their coefficients. For example, Kapton's coefficient of thermal expansion is very much larger than that of a silicon solar cell, while the coefficients of the glass fibers used in this invention and a solar cell are closer by at least one magnitude. With this invention, these coefficients can be much more closely matched.

Furthermore, with this Invention a very compatible adhesive can be used between the blanket and the cells, which is advantageous both chemically and structurally.

Accordingly, it is another object of this invention to provide a blanket/solar cell system in which internal stresses are significantly reduced, compared to conventional systems.

BRIEF DESCRIPTION OF THE INVENTION

This invention is a system comprised of an array of solar cells and a flexible support blanket. The cells are mounted to the blanket by an adhesive. The support blanket includes a central core of woven cloth made of glass fibers. Preferably, the glass fibers will be of quartz, i.e., pure silicon dioxide, because of the ready traceability of such fibers, which is essential when the fibers are utilized in airborne or space devices. However, the term "glass fiber" also encompasses fibers which are principally constituted of silicon dioxide, but might also include alloying compounds or elements.

The cloth is coated with a silicone. The silicone is resistant to attack by atomic oxygen, as are the glass fibers. The blanket thereby consists almost entirely of a material which is resistant to atomic oxygen. If desired, the silicone can be loaded with alloying compounds to increase its thermal conductivity. In any event, it is a good electrical insulator.

The woven cloth has interstices between adjacent parallel bundles of glass fibers, and the coating covers the bundles. The interstices are not completely filled, which provides apertures for improved radiation of heat from the blanket because of the resulting apertures between the coated bundles.

The above and other features of this invention will be fully understood from the following detailed description and the accompanying drawings, in which:

DETAILED DESCRIPTION OF THE INVENTION

Figure 1:
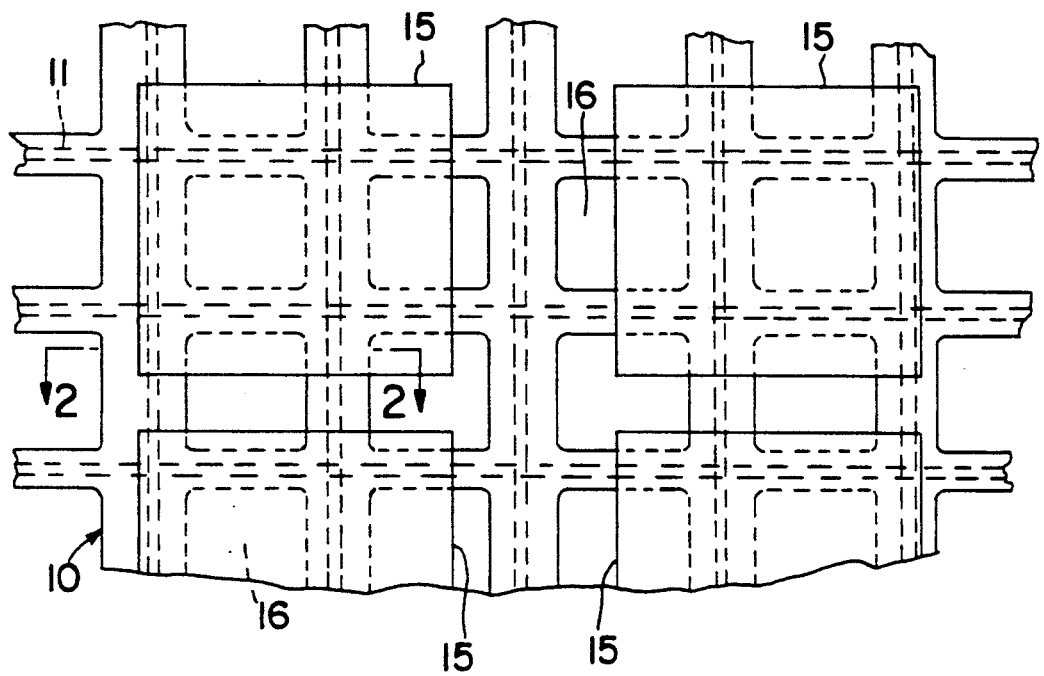
FIG. 1 is a plan view of a portion of a system according to this invention.
Figure 2:
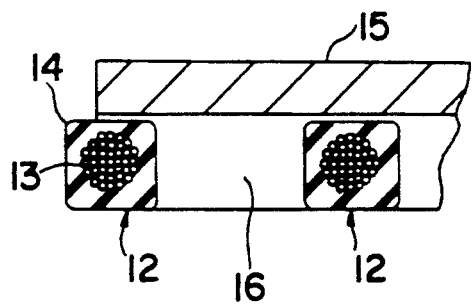
FIG. 2 is a cross-section taken at line 2—2 in FIG. 1

A blanket 10 according to the invention is shown formed of bundles 11, 12 of glass fibers 13 crossed at right angles to one another to create a rectangular grid with open interstices 16 between them.

Many grid arrangements are suitable for use with this invention, including flat-laid bundles, in which one set of bundles is laid upon and across the other. A more suitable arrangement is a conventional over-and-under weave in which one set is crossed by the other, alternate sets crossing above, and the other sets crossing beneath.

A disadvantage of a laid arrangement is the freedom of the cloth to distort while being handled. Even a simple weave is an improvement, because the cloth is more reliably handled while it is laid out for further processing.

The presently-preferred weave is commercially known as a Leno weave. In this weave, the bundles are somehow joined at intervals so as to resist, at least In one direction, distortion of the cloth. Leno weaving techniques are well-known in the weaving art, and require no detailed description here. Resistance to distortion, even along only one dimension greatly facilitates the handling of the cloth.

A suitable cloth is next coated with a silicone 14. The silicone is applied as a fluid or as a paste. When the bundles are fully coated, the silicone will be cured to form a flexible solid. When cured, it forms a structural connection at the intersections of the bundles which tends to stabilize the coated material against excessive distortion out of shape, and also coats the bundles. Because internal fibers in each bundle may not be fully coated, there is at least some movement of fibers possible within the weave. However, this will not adversely affect the general dimensional stability of the coated cloth.

The cloth fibers can be made in many grades and types. If desired, a single monofilament fiber could be used, which still will be regarded as a "bundle", but this usually will not be preferred because then the cloth would be undesirably stiff. Instead, bundles of much smaller parallel fibers in a group will usually be used. Fibers having a diameter on the order of 4.5 microns, gathered as a parallel group to form a bundle between about 0.003 and 0.005 inches in diameter has proved to be useful. In the weave, about 10 of these bundles per inch in each direction work well. The resulting cloth can readily be folded without cracking or breakage, provided that the fold is not too sharp.

The term "glass fiber" is used generically herein to denote a fiber which is predominantly made of silicone dioxide. Glass fibers often have additional elements added for various purposes, and are suitable when these additives are not deleterious to the survival of the blanket in its intended environment.

Fibers of pure quartz fall within the definition of glass fibers, and are preferred, because there is literally no chance for adverse reactions with oxygen, and because they are readily documented for traceability. This is a requirement in airborne and space devices. A suitable fiber is made by Quartz Products Company, 1600 West Lee Street, Louisville, Ky., under its trademark QUARTZEL.

The woven cloth may be used as a single layer, or as layers laid one above another, as preferred. Usually a single cloth thickness will give adequate support.

A useful Leno woven cloth of this fiber is sold by said BGF Industries, Inc., under its style number 1653.

The silicone 14 is preferably applied as an uncured fluid or paste. When the cloth is dipped in a fluid, it is drained, and then cured usually but not always with heat. Preferably the interstices between the bundles are not filled, in order that the cured blanket may have least weight and maximum flexibility, while still being able to support an array of solar cells, and hold the cloth in a reasonably stable shape. The open interstices form apertures 16 which facilitate radiation of heat so the cells 15 can run cooler. When the silicone is applied as a paste, care will be taken to keep the apertures open.

Quartz fibers are preferred because of their close match with the coefficient of thermal expansion of a silicon solar cell. However, they are also suitable for use with other types of solar cells, such as cells based on germanium. While the match of coefficients of thermal expansion will not be as close as with silicon cells, it is very much closer then any match that can be made with Kapton, so this invention constitutes a substantial improvement with either kind of solar cell.

Any silicone adhesive which is adherent to glass fibers, has a high thermal conductivity, high electrical resistance, and resistance to atomic oxygen can be used. Of course it must also be compatible with a high vacuum environment. A suitable silicon-adhesive is sold by McGhan Nusil of Carpinteria, Calif. as its CV2568. This is an uncured silicone which is heat-cured when in place. The manufacturer's instructions for curing will be followed for processing. This same silicone can be used as an adhesive to mount solar cells 15 to the coated cloth. It may be desirable to modify the silicone for curing at room temperature.

The fiber dimensions, bundle dimensions, weave characteristics, and blanket thickness will all be selected to provide a suitably firm substrate to support an array of cells 15, while remaining foldable for storage. The use of a flexible silicone rather than a rigid coating of silicon dioxide further enables such folds and bends to be made.

This invention is not to be limited by the embodiment shown in the drawings and described in the description, which is given by way of example and not of limitation, but only in accordance with the scope of the appended claims.

I claim:

1. A solar array consisting essentially of:
   an array of solar cells each said cell having a pair of oppositely facing faces; and a substrate blanket comprising a cloth formed of crossed bundles of glass fibers, and flexible cured silicone enclosing said bundles, one face of each of said solar cells being adhered to said blanket by cured silicone, said fibers being gathered in bundles, there being open interstices between said adjacent bundles, at least a central portion of said interstices not being occluded by said silicone so as to form apertures therethrough, whereby said one face of the cells is completely exposed, and the other said face is partially exposed through said interstices.

2. A combination according to claim 1 in which said bundles are woven to form said cloth.

3. A combination according to claim 2 in which said bundles are woven in a Leno weave.

4. A combination according to claim 1 in which said cells are adhered to said blanket by a silicone adhesive.

5. A combination according to claim 1 in which said glass fibers consist of quartz.

6. A substrate blanket for directly supporting an array of solar cells, said blanket consisting of a cloth formed of cross-laid bundles of glass fibers and flexible cured silicone enclosing said bundles, said blanket being foldable without cracking of the silicone or substantial breakage of the glass fibers, there being open interstices between said adjacent bundles, at least a central portion of said interstices not being occluded by said silicone in order to form apertures therethrough.

7. A substrate blanket according to claim 6 in which said bundles are woven to form said cloth.

8. A substrate blanket according to claim 7 in which said bundles are woven in a Leno weave.

* * * * *